(12) United States Patent
Yip et al.

(10) Patent No.: US 7,741,196 B2
(45) Date of Patent: Jun. 22, 2010

(54) SEMICONDUCTOR WAFER WITH IMPROVED CRACK PROTECTION

(75) Inventors: Heng Keong Yip, Selangor (MY); Wai Yew Lo, Petaling Jaya (MY); Lan Chu Tan, Selangor (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/668,453

(22) Filed: Jan. 29, 2007

(65) Prior Publication Data

US 2008/0179710 A1 Jul. 31, 2008

(51) Int. Cl.
H01L 21/30 (2006.01)
(52) U.S. Cl. ............... 438/462; 438/465; 257/E21.599
(58) Field of Classification Search ........ 438/460–465; 257/E21.599
See application file for complete search history.

(56) References Cited

U.S. PATENT DOCUMENTS

2003/0216009 A1* 11/2003 Matsuura et al. ............ 438/460
2004/0121563 A1* 6/2004 Farnworth et al. .......... 438/465
2004/0169258 A1* 9/2004 Iijima ......................... 257/620
2005/0039673 A1* 2/2005 Ishida ......................... 117/90
2005/0145993 A1* 7/2005 Sasaki et al. ................ 257/620
2005/0266661 A1 12/2005 Li et al.
2005/0269720 A1 12/2005 Burke et al.
2005/0282360 A1* 12/2005 Kida et al. .................. 438/462
2006/0055002 A1 3/2006 Yao et al.
2006/0073676 A1* 4/2006 Chen et al. .................. 438/460
2006/0189099 A1* 8/2006 Lu et al. ..................... 438/460
2006/0223234 A1* 10/2006 Terayama et al. ........... 438/113

* cited by examiner

Primary Examiner—Hsien-ming Lee
Assistant Examiner—Kevin Parendo
(74) Attorney, Agent, or Firm—Charles Bergere (57) ABSTRACT

A method of manufacturing a semiconductor wafer for dicing includes providing a semiconductor wafer including a substrate and a plurality of upper layers on the substrate that form a formation of die areas. The formation is arranged so that adjacent die areas are separated by a path for a dicing tool. Within each path, a pair of spaced apart lines is fabricated. Each line defines a dicing edge of a respective path and has at least one trench extending between a top surface of the wafer and the substrate. Each trench is filled with a stress absorbing material for reducing die tool induced stress on the die areas during dicing.

15 Claims, 7 Drawing Sheets

SEMICONDUCTOR WAFER WITH IMPROVED CRACK PROTECTION

BACKGROUND OF THE INVENTION

The present invention relates generally to the manufacture of semiconductor wafers and more particularly, to a method of manufacturing semiconductor wafers that include protection from die tool induced crack propagation.

An individual integrated circuit or chip is usually formed from a larger structure known as a semiconductor wafer, which is usually comprised primarily of silicon, although other materials such as gallium arsenide and indium phosphide may be used. The semiconductor wafer includes a plurality of integrated circuits arranged in rows and columns with the periphery of each integrated circuit typically being square or rectangular in shape.

Typically, after fabrication the semiconductor wafer is sawn or "diced" into square or rectangular shaped discrete integrated circuits along two mutually perpendicular sets of parallel lines or streets lying between each of the rows and columns of integrated circuits. The singulated integrated circuits are typically referred to as die.

During the dicing process, the dicing tool can induce stresses on the semiconductor wafer that can lead to crack propagation through the dies. Crack propagation can severely damage, or at the very least degrade, the resultant integrated circuit.

Several methods have been devised for reducing dicing tool induced damage by crack propagation. For example, US 2006/0055002 describes a method in which a continuous seal ring, for blocking lateral movement of mobile ions, is implemented around metal layers that make up the film stack. According to US 2006/0055002, a shallow trench is also created beneath the surface of the silicon substrate by etching into a portion of the silicon substrate to circumscribe the seal ring. An oxide is then deposited into the etched trench to create a shallow trench isolator in the silicon substrate for reducing crack propagation through the silicon substrate. Although the method disclosed in US 2006/0055002 may reduce dicing tool induced crack propagation through the silicon substrate, the method addresses a different problem to the present invention in that the disclosed method does not address the problem of inter-layer delamination.

US 2005/0269720 discloses another method for providing crack protection for a silicon die. According to the method disclosed in US 2005/0269720, the wafer includes a nitride passivation layer that includes gaps along scribe streets to expose an oxide. A dicing tool can then cut along the scribe streets without producing cracks that propagate into die termination areas.

US 2005/0266661 discloses a semiconductor wafer that includes ditches in the scribe street. The ditches extend from the top surface of the wafer to the silicon substrate. According to US 2005/0266661, the disclosed arrangement of ditches is effective in preventing damage, such as chipping and cracking, at the chip edges. However, as with the other prior methods described earlier, the semiconductor wafer disclosed in US 2005/0266661 does not address the problem of dicing tool induced interlayer delamination between the layers deposited onto the silicon substrate.

It is an object of the present invention to provide a semiconductor manufacturing method that produces a semiconductor wafer incorporating improved protection against crack propagation and interlayer delamination caused by die separation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF THE INVENTION

The semiconductor substrate described herein can be any semiconductor material or combinations of materials, such as gallium arsenide, silicon germanium, silicon-on-insulator (SOI), silicon, monocrystalline silicon, the like, and combinations of the above.

The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiments shown but is to be accorded the widest scope consistent with the principles and features described herein.

The present invention provides a method of manufacturing a semiconductor wafer for dicing, the method comprising: providing a semiconductor wafer including a substrate and a plurality of upper layers thereon forming a formation of die areas, the formation arranged so that adjacent die areas are separated by a path for a dicing tool; fabricating, within each path, a pair of spaced apart lines, each line defining a dicing edge of a respective path and comprising at least one trench extending between a top surface of the wafer and the substrate; and filling each trench with a stress absorbing material for reducing die tool induced stress on the dies during dicing.

Preferably, each line is a fabricated as a line of trenches arranged end to end. In one embodiment, the ends of consecutive trenches are spaced apart. For example, in one embodiment the spacing between the ends of consecutive trenches is in the range of 5 µm to 10 µm.

Each trench preferably includes opposite ends that are shaped to promote crack propagation between the ends of consecutive trenches during dicing. In other words, in one embodiment the ends of the trenches are shaped to promote crack propagation between the trenches and along a respective scribe line. In such an embodiment, the ends of the trenches may have any suitable shape that promotes crack propagation in the desired direction. For example, the shape of the ends of the trenches may be tapered, or semi-circular, or acuate.

The stress absorbing material may include a polymer, a synthetic wax, or a silicone. In an embodiment in which the stress absorbing material is a polymer, it is preferred that the polymer is a low stress polymer resin.

In one embodiment, a second pair of lines is located between the first pair. In such an embodiment, the trenches of the first and second pair of lines may have substantially the same dimensions. In addition, the trenches of the first and second pair of lines may be offset length-wise relative to each other so as to overlap therewith along their length, and be spaced apart therefrom width-wise.

In one embodiment the trenches of the first and second pair of trenches overlap an associated trench of a respective scribe line by about an amount of about between one-third and one-half of the trench length.

The present invention also provides a semiconductor wafer comprising: a substrate; a plurality of upper layers on the substrate, the upper layers forming a formation of die areas, the formation arranged so that adjacent die are separated by a path for a dicing tool; a pair of spaced apart lines within each path, each line of the pair defining a dicing edge of a respective path and comprising at least one trench extending between a top surface of the wafer and the substrate wherein each trench is filled with a stress absorbing material for reducing die tool induced stress on the dies during dicing.

Other aspects and advantages of the present invention will become apparent from the following detailed description, taken in conjunction with the accompanying drawings, illustrating by way of example the principles of the invention.

Figure 1:
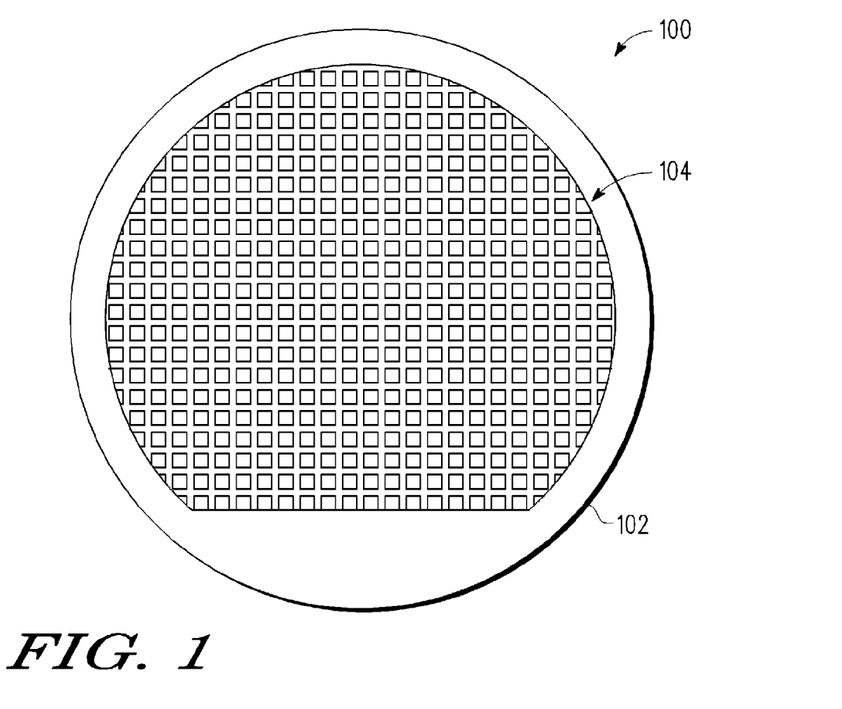
FIG. 1 is a top view of a semiconductor wafer illustrating an example layout of dies.

FIG. 1 depicts a top view of a conventional semiconductor wafer 100. The semiconductor wafer 100 includes a substrate 102 and a plurality of upper layers on the substrate that are arranged to provide a formation 104 of die areas (not shown) shown here as part circular array of die areas. As would be understood by a skilled person, each die area provides an integrated circuit including one or more microelectronic circuits.

Figure 2:
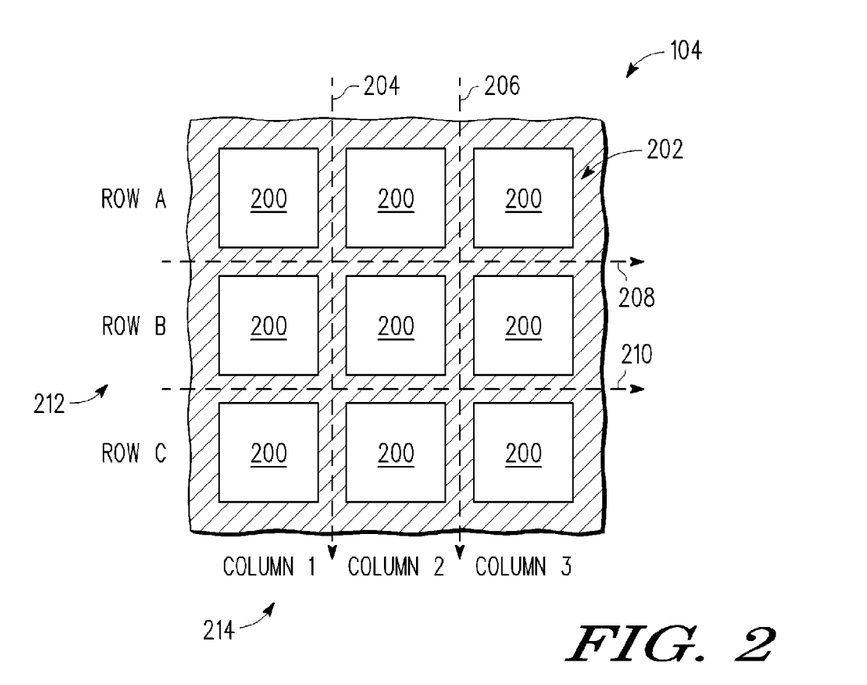
FIG. 2 is a partial top view of the semiconductor wafer shown in FIG. 1 showing a formation of die areas in more detail.

FIG. 2 depicts a close-up view of a sub-array of the die areas illustrated in FIG. 1. As shown in more detail in FIG. 2, the formation 104 of die areas 200 is arranged to provide an area 202 (shown in hatched lines) comprising intersecting paths 204, 206, 208, 210 for a dicing tool. The intersecting paths 204, 206, 208, 210 are arranged as mutually perpendicularly sets and located between each of the rows 212 and columns 214 of die areas 200. In other words, each of the intersecting paths 204, 206, 208, 210 separate adjacent die areas 200 so that, for example, the die areas 200 of "Row A", are separated from the die areas of "Row B" by path 208. Thus, in order to singularize each of the die areas 200, a dicing tool travels (or acts) along each of the intersecting paths 204, 206, 208, 210 so as to dice each of the die areas 200. Thus, in the present case, a dicing the formation 104 of die areas 200 depicted in FIG. 2 would yield nine die areas 200.

As will be appreciated by a skilled reader, each of the intersecting paths 204, 206, 208, 210 is typically referred to as a 'scribe street' or 'saw scribe'.

Figure 3A:
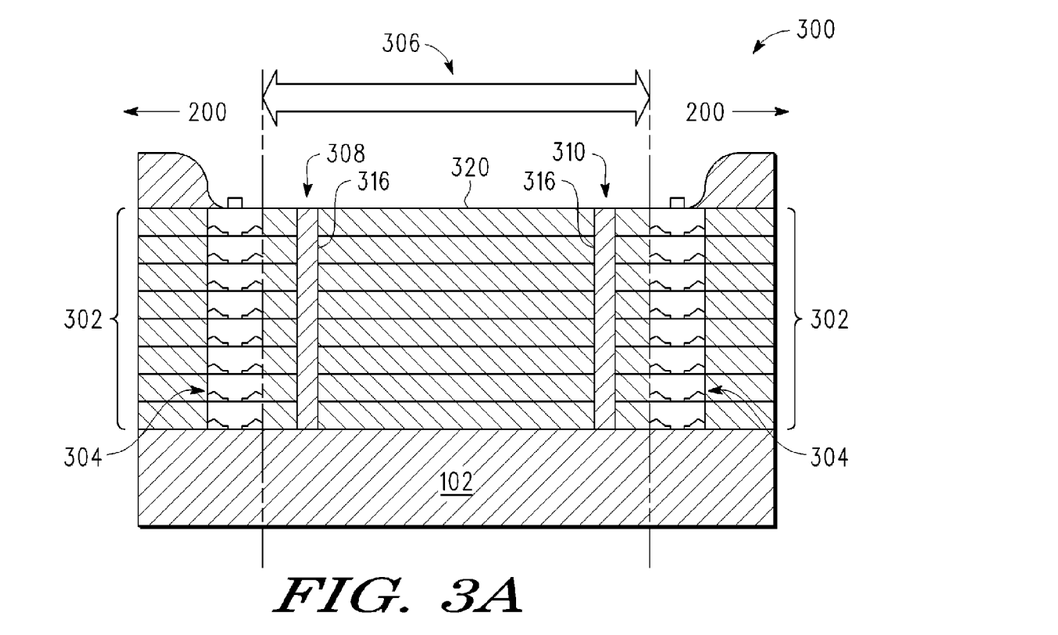
FIG. 3A is a partial cross-sectional view of a semiconductor wafer in accordance with an embodiment of the present invention.

FIG. 3A depicts a partial cross section view of a semiconductor wafer 300 according to an embodiment of the present invention viewed across a path 306. The path 306 separates adjacent die areas 200 and provides a path for a dicing tool. For clarity, the die areas 200 bordering the path 306 are shown truncated.

The semiconductor wafer 300 illustrated in FIG. 3A includes a substrate 102 and a plurality of upper layers 302 on the substrate 102.

In the path 306, the upper layers 302 include layers of dielectric material. On the other hand, in the die areas 200, the upper layers 302 include conductive and non-conductive materials that are interconnected and arranged to form microelectronic circuits. The processes and techniques for forming the microelectronic circuits in the die areas 200 would be within the knowledge of a skilled person.

The semiconductor substrate 102 is typically a silicon substrate, although it is to be appreciated that other materials such as such as gallium arsenide and indium phosphide may be used. The semiconductor wafer 300 also includes plural edge seals 304, the function of which is well understood by a skilled person.

As shown in FIG. 3A, the semiconductor wafer 300 includes a pair of spaced apart lines 308, 310 located within the path 306. Each line 308, 310 extends parallel with a respective edge seal 304 and defines a dicing edge 312, 314 of the path 306.

In the embodiment illustrated in FIG. 3A to FIG. 4A, each line 308, 310 comprises at least one continuous trench 316 that extends between a top surface 320 of the semiconductor wafer 300 and through to the substrate 102. As shown in FIG. 4B, the trench 316 circumscribes a respective die area 200 so as to form a border thereabouts.

The trench 316 may be formed using any suitable manufacturing process, such as, for example, photolithography, dry etching or laser processes. Preferably though, each trench 316 is etched, using a conventional wet or dry etching technique. In terms of the width (W) 330 (FIG. 4A) of each trench 316, the width of the trenches 316 may be between about 3 µm to about 10 µm, but is typically about 5 µm.

In the illustrated embodiment, each trench 316 has a generally rectangular shaped cross sectional profile. However, it is to be appreciated that other cross sectional profiles may be used, such as, for example, a wedge shape.

Irrespective of the cross sectional profile, each trench 316 is filled with a stress absorbing material for reducing die tool induced stresses on the dies during a dicing process. In the present case, the stress absorbing material is a low stress polymer resin, such as a polyamide. However it is to be appreciated that other types of material may be used such as, for example, another polymer, a synthetic wax or a silicone.

Filling each trench 316 with a stress absorbing material provides a plug or 'rivet' like structure that reduces die tool induced stresses on the die areas 200 during dicing. Consequently, the semiconductor wafer 300 is less susceptible to interlayer delamination (ILD) for both low-K and non low-K semiconductor products.

Figure 3B:
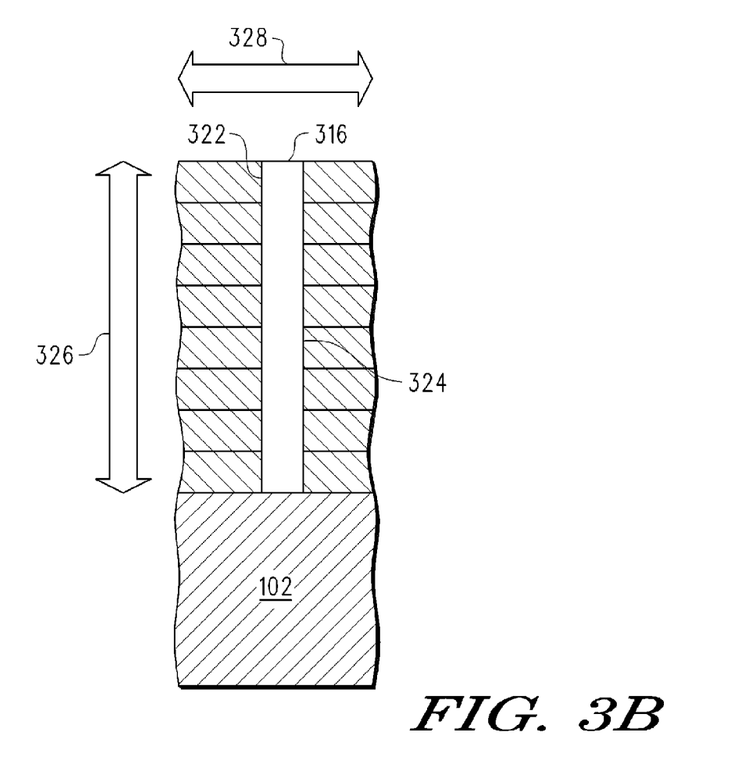
FIG. 3B is a partial sectional view of the semiconductor wafer shown in FIG. 3A showing a trench in more detail.
Figure 4A:
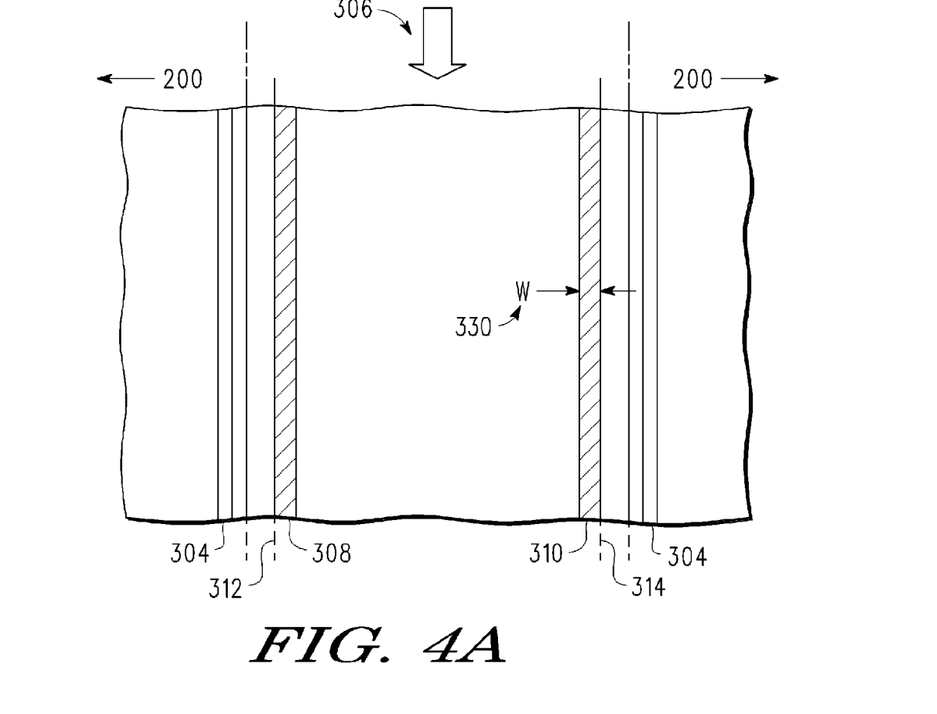
FIG. 4A is a top view of the section of the semiconductor wafer shown in FIG. 3A.
Figure 4B:
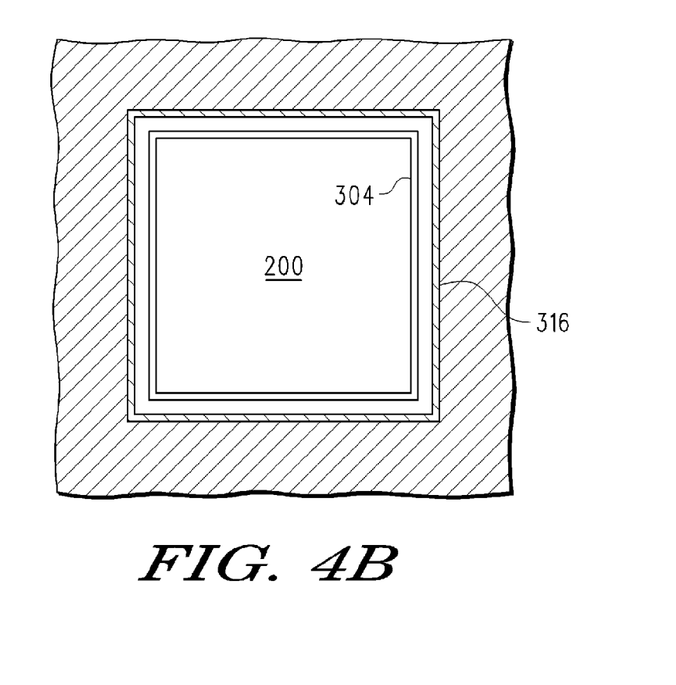
FIG. 4B is a partial top view of a die area of the section of the semiconductor wafer shown in FIG. 4A.

As shown in more detail in FIG. 3B, bonding between the stress absorbing material within the trench 316 and the walls 322, 324 interfacing the stress absorbing material and the layers 302 is expected to provide further protection from die tool induced interlayer delamination. The resultant plug or 'rivet' like structure tends to support the layers 302 along the depth 326 of the trench 316. In other words, the bond tends to hold the layers 302 together during a dicing process, and thus reduces the susceptibility of the semiconductor wafer 300 to interlayer delamination. In addition, the presence of the stress absorbing material in the trench 316 also provides rigidity to the semiconductor wafer 300 across the trench 316 widthwise 328 and thus reduces the susceptibility of the semiconductor wafer 300 to interlayer delamination that may arise from flexing the wafer.

In addition to reducing the susceptibility of the semiconductor wafer 300 to interlayer delamination, the plug or 'rivet' like structure also reduces the susceptibility of the semiconductor wafer 300 to die edge and corner chipping during the dicing process by providing protection to the die edges and corners. In effect, the stress absorbing material provides a protective barrier that circumscribes the die area 200.

Filling the trenches 316 with the stress absorbing material preferably occurs during wafer fabrication. Ideally, the stress absorbing material is applied to the semiconductor wafer 300 as a final wafer surface during wafer fabrication.

Figure 5:
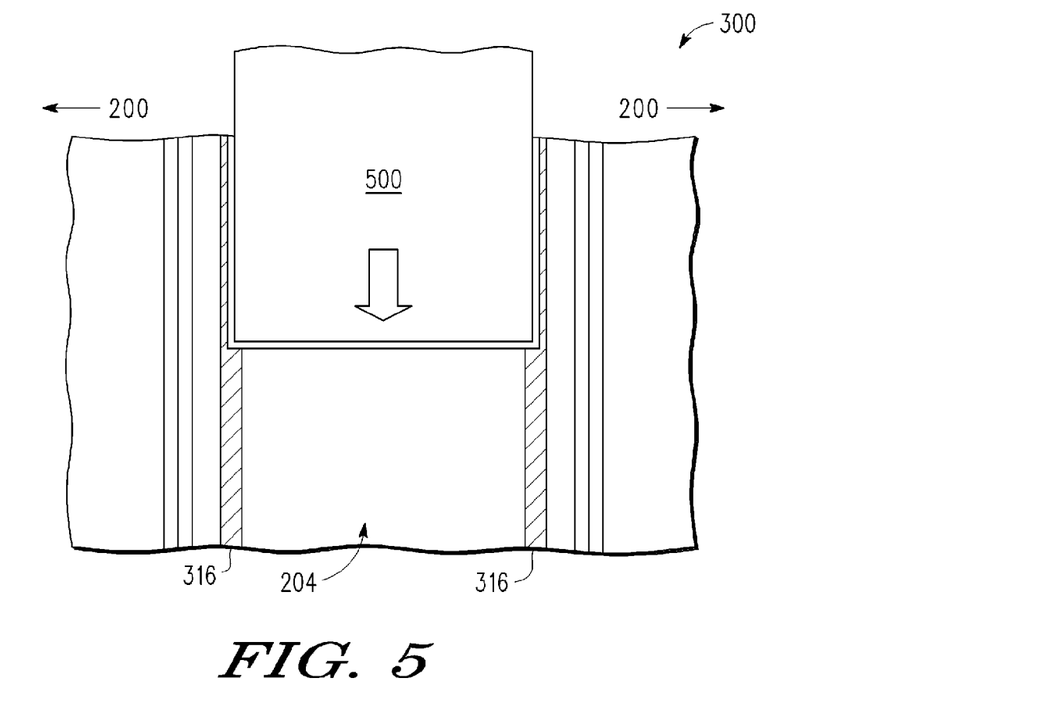
FIG. 5 is a top view of the embodiment shown in FIGS. 3A and 4A during dicing.

Referring now to FIG. 5, during a dicing process, a dicing tool (such as a dicing saw) separates adjacent die areas 200. If the dicing tool is a dicing saw 500, then the separation of adjacent die areas 200 involves the blade of the dicing saw 500 cutting along the path 306. The types of dicing tools that may be used to perform the dicing process, such as dicing saws, would be within the knowledge of a skilled person.

As shown in FIG. 5, during the dicing process, the dicing tool 500 interacts with the stress absorbing material in the trench 316 and does not contact the edges of the layers 302 (FIG. 3A). The stresses induced by the dicing tool 500 are absorbed, at least to an extent, by the stress absorbing material filling the trenches 316 and so further reduces the likelihood of crack propagation, and thus interlayer delamination, in the layers 302 of the die area 200.

Figure 6:
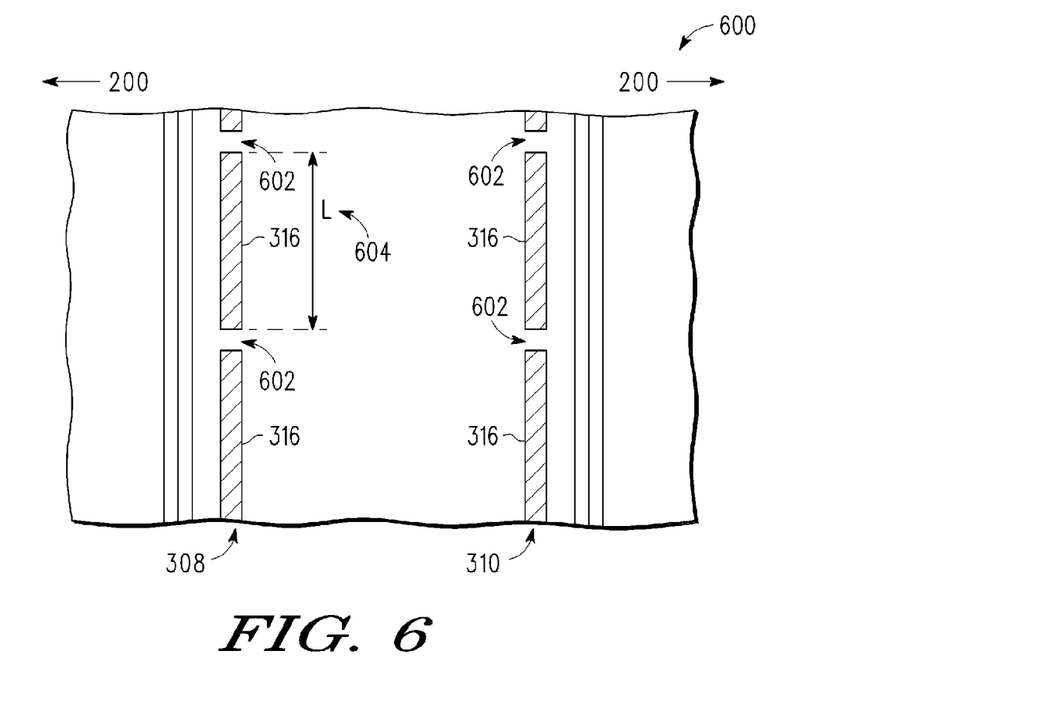
FIG. 6 is a partial top view of a semiconductor wafer in accordance with a second embodiment of the present invention.

FIG. 6 depicts a partial top view of a semiconductor wafer 600 in accordance with a second embodiment of the present invention. The second embodiment also includes a pair of lines 308, 310. However, in this embodiment each of the lines 308, 310 comprises spaced apart trenches 316, arranged end to end. As shown, each trench has a generally rectangular shape along its length as well as a generally rectangular cross sectional profile. Each trench 316 contains a stress absorbing material, as per the previously described embodiment.

An arrangement of trenches 316 of the type illustrated in FIG. 6 provides additional protection from the crack propagation and thus from interlayer delamination. In particular, a gap 602 between the ends of consecutive trenches 316 provides a zone of mechanical weakness that tends to divert crack propagation along a respective scribe line 308, 310, rather than towards the die area 200. In other words, crack propagation arising from dicing tool induced stresses will tend to be diverted in the same direction as the lines 308, 310 and be located in the gap 606 between the ends of consecutive trenches forming a respective scribe line 308, 310.

In the embodiment illustrated in FIG. 6, each corner of the trenches 316 provides a point at which dicing tool induced stresses will be concentrated, and thus provides points where crack propagation is more likely to initiate. In the present case, because the ends of consecutive trenches 316 include right-angled corners, crack propagation is diverted between the corners of the consecutive trenches of the same scribe line 308, 310. In the illustrated embodiment, the length 604 of the trenches is 50 μm. However, the length may be in the range of between 30 μm to 80 μm.

Figure 7:
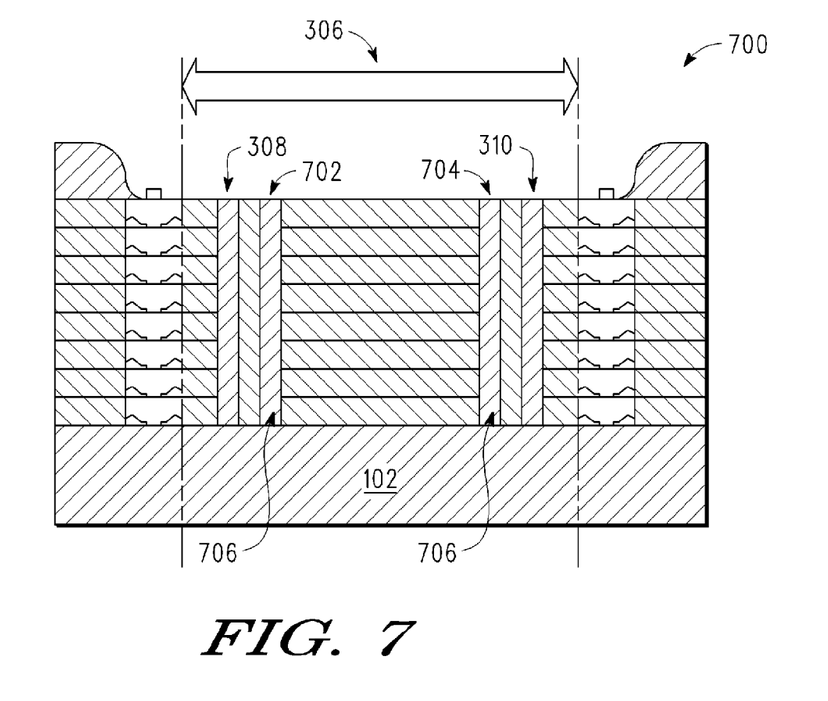
FIG. 7 is a partial cross-sectional view of a semiconductor wafer in accordance with a third embodiment of the present invention.
Figure 8:
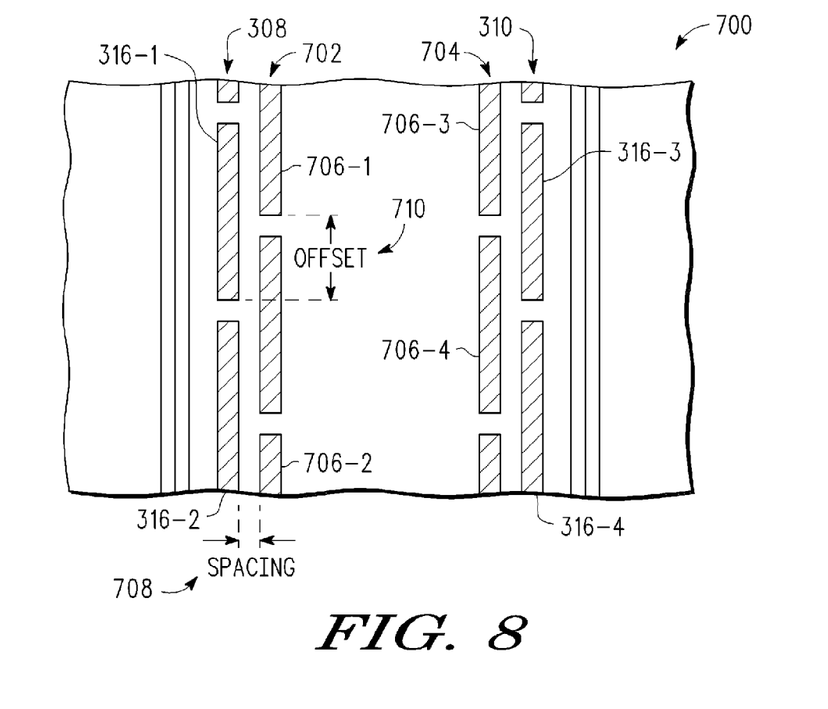
FIG. 8 is a top view of the section of the semiconductor wafer shown in FIG. 7.

FIGS. 7 and 8 depict partial sectional and top views respectively of a semiconductor wafer 700 in accordance with a third embodiment of the present invention. In the third embodiment illustrated in FIG. 7, a second pair of lines 702, 704 of trenches 706 is located between the first pair of lines 308, 310 and arranged parallel therewith (FIG. 8). Each line 702, 704 of trenches 706 of the second pair is associated with and spaced apart from a respective one of the pair of lines 308, 310 of the first pair.

In the embodiment illustrated in FIGS. 7 and 8, each trench 706 of the second pair of lines 702, 704 is fabricated in the same manner as the trenches 316 of the first pair of lines 308, 310. As a result, each trench 706 of the second pair of lines 702, 704 has substantially the same width and length as the trenches 316 comprising the lines 308, 310. In addition, each trench 706 is also filled with the same stress absorbing material as that used in the trenches 316. Although in the illustrated embodiment, the trenches 316 comprising the first pair of lines 308, 310 have the same dimensions as the trenches 316 comprising the second pair of lines 702, 704 it will be appreciated that it is not essential that the dimensions be the same. Indeed, in other embodiments, the length and/or width of the trenches 316 comprising the lines 308, 310 and the trenches 706 comprising the lines 702, 704 may be different.

As shown in FIG. 8, the trenches 706 of the second pair of lines 702, 704 are offset 710 laterally and spaced apart 708 transversely from associated trenches 316 of the first pair of lines 308, 310. In the illustrated embodiment, the spacing 708 is about 5 μm. However, the spacing may be in the range of between about 5 μm to 10 μm. In terms of the offset between the ends of associated trenches (shown in FIG. 8 as numerically paired references, for example, 316-1, 706-1), in the illustrated embodiment the offset 710 is about 15 μm, which is the equivalent of about one-third of the trench length (L). However, the offset 710 may be between one-third and one-half of the trench length (L).

Figure 9:
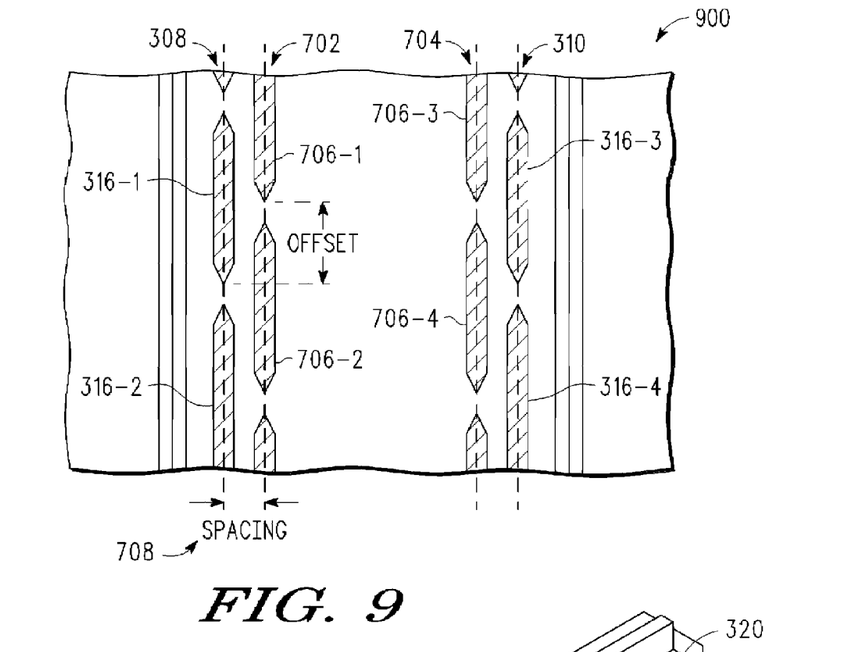
FIG. 9 is a partial top view of a semiconductor wafer in accordance with a fourth embodiment of the present invention.
Figure 10:
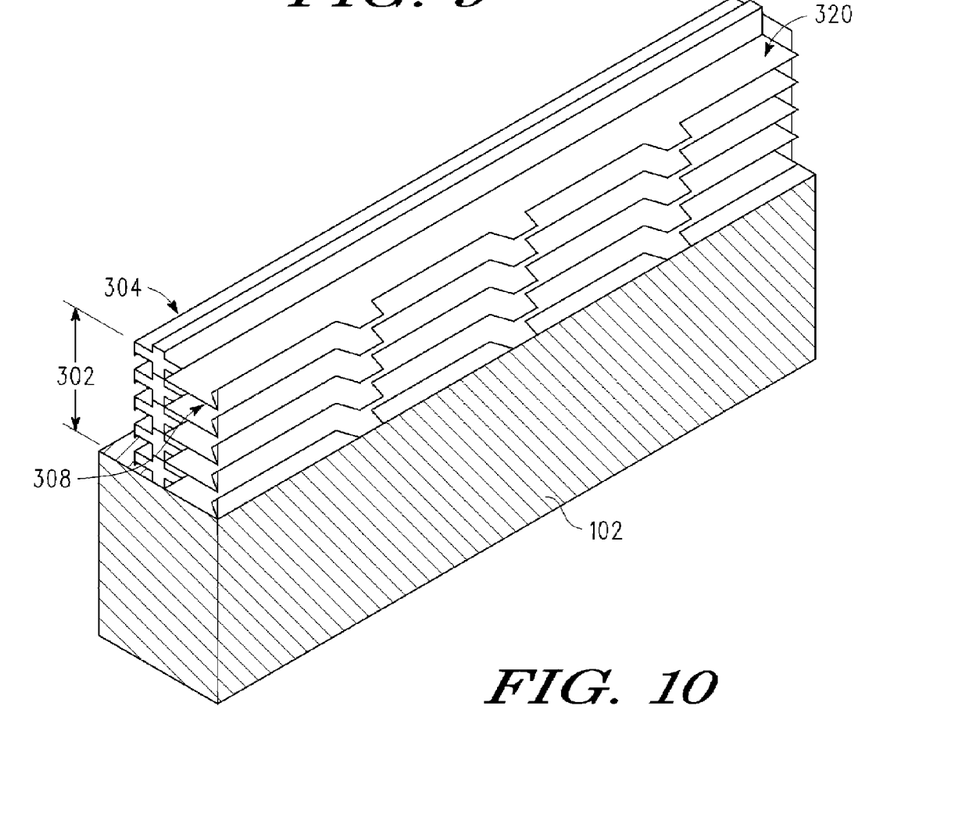
FIG. 10 is a perspective view of the embodiment shown in FIG. 9.

FIG. 9 depicts another partial view of a fourth embodiment of a semiconductor wafer 900 in accordance with the present invention. The embodiment illustrated in FIG. 9 is similar to the embodiment illustrated in FIG. 7 and FIG. 8. However, in this embodiment the ends of the trenches 316, 706 are shaped to promote point-to-point crack propagation between the ends of the trenches 316-n, 704-n (where n=1 to 4). In the present case, the ends of the trenches 316, 706 are tapered and terminate at an acuate head. The acuate head provides a stress point for concentrating dicing tool induced stresses and thus provides a point where crack propagation is more likely to initiate. In addition, because each of the consecutive trenches includes an acuate head, crack propagation is diverted between the head of the consecutive trenches of the same line of trenches, as is depicted in FIG. 10.

As will be appreciated, although the embodiment illustrated in FIG. 9 includes trenches having ends that taper inwardly from each side of the trench to terminate at an acuate head, it is to be appreciated that other shaped heads may be used to achieve the same result. However, it is preferred that the ends include an acuate head having tapered sides extending therefrom at an acute angle.

Figure 11:
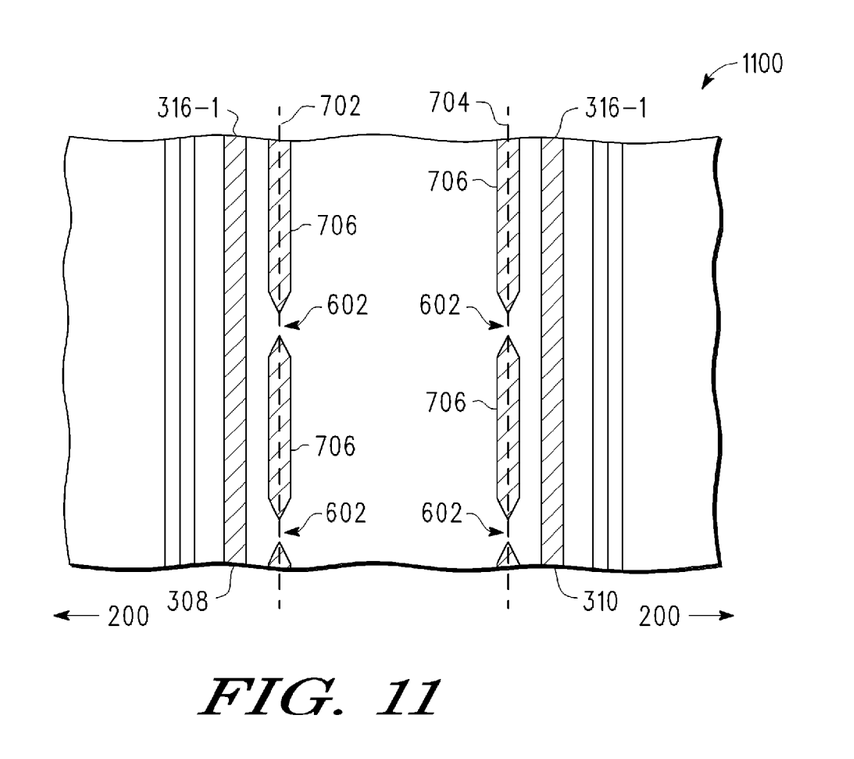
FIG. 11 is a partial top view of a semiconductor wafer in accordance with a fifth embodiment of the present invention.

FIG. 11 depicts a partial top view of a fifth embodiment of a semiconductor wafer 1100 in accordance with the present invention. The embodiment illustrated in FIG. 11 includes a combination of lines 308, 310 comprising trenches 316 of the type described with reference to FIGS. 3A and 4A, combined with a second pair of lines 702, 704 lines of trenches 706 of the type described with reference to FIG. 9.

As will be appreciated, other combinations may also be formed without departing from the scope of the present invention. In this embodiment, the lines 702, 704 of trenches 706 provides an initial protection mechanism to divert dicing tool induced crack propagation through the gaps 602. The lines 308, 310 comprising trenches 316 provide a secondary protection mechanism that buffers the die area 200 from dicing tool induced stresses and thus further reduces the susceptibility of the semiconductor wafer 1100 from resultant damage or degradation. As will be appreciated, the depicted first pair of lines 308, 310 and second pair of lines 702, 704 may be interchanged so that the lines 308, 310 comprise a line of spaced apart trenches and the lines 702, 704 comprise a continuous trench.

While some embodiments of the present invention have been illustrated here in detail, it should be apparent that modifications and adaptations to these embodiments may occur to one skilled in the art without departing from the scope of the present invention as set forth in the following claims. Thus, the specification and figures are to be regarded in an illustrative rather than restrictive, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A method of manufacturing a semiconductor wafer for dicing, the method comprising:
   providing the semiconductor wafer including a substrate having a plurality of upper layers and a plurality of die areas, wherein adjacent die areas are separated by a path for a dicing tool;
   fabricating, within each path, a pair of spaced apart lines, each of the spaced apart lines defines a dicing edge of the path and comprises a plurality of trenches having ends, wherein the trenches are arranged end to end such that apexes of longitudinally aligned trenches point towards each other, and wherein a horizontal cross-section of each end of consecutive trenches has an acuate shape that promotes propagation of cracks therebetween during dicing, and wherein each trench extends between a top surface of the semiconductor wafer and the substrate; and
   filling each trench with a stress absorbing material for reducing die tool induced stress on the die areas during dicing.

2. The method of manufacturing the semiconductor wafer according to claim 1, wherein the ends of consecutive trenches are spaced apart.

3. The method of manufacturing the semiconductor wafer according to claim 2, wherein a spacing between the ends of consecutive trenches is in a range of about 5 μm to about 10 μm.

4. The method of manufacturing the semiconductor wafer according to claim 1, wherein a length of each trench is in a range of about 30 μm to about 80 μm.

5. The method of manufacturing the semiconductor wafer according to claim 1, wherein the stress absorbing material is selected from one of a polymer, a synthetic wax, and a silicone.

6. The method of manufacturing the semiconductor wafer according to claim 1, further comprising, prior to the step of filling each trench with the stress absorbing material, fabricating a second pair of lines between the first pair of lines, each line of the second pair comprising at least one additional trench that is parallel with the trenches of the first pair of lines, and wherein each line of the second pair is offset transversely from an associated trench of the first pair of lines so as to be spaced therefrom by a spacing in a range of between about 5 μm to about 10 μm.

7. The method of manufacturing the semiconductor wafer according to claim 6, wherein dimensions of the additional trenches of the second pair of lines are equal to dimensions of the trenches of the first pair of lines, and wherein the additional trenches of the second pair of lines are offset longitudinally relative to the trenches of the first pair of lines so as to overlap by an extent along their length.

8. A semiconductor wafer, comprising:
   a substrate;
   a plurality of upper layers and a plurality of die areas formed on the substrate, wherein adjacent die areas are separated by a path for a dicing tool;
   a pair of spaced apart lines within each path, each line of the pair defining a dicing edge of the path and comprising a plurality of trenches that extend between a top surface of the wafer and the substrate, and wherein the trenches have ends, and the trenches are arranged end to end, each end having a horizontal cross-section that has an acuate shape that promotes cracking propagation therebetween during dicing and wherein apexes of the acuate ends of consecutive trenches point at each other; and
   a polymeric stress absorbing material disposed within each trench for reducing die tool induced stress on the plurality of die areas during dicing.

9. The semiconductor wafer according to claim 8, wherein the ends of consecutive trenches are spaced apart.

10. The semiconductor wafer according to claim 9, wherein a spacing between the ends of consecutive trenches is in a range of between about 5 μm to about 10 μm.

11. The semiconductor wafer according to claim 8, wherein a length of each trench is in a range of between about 30 μm to about 80 μm.

12. The semiconductor wafer according to claim 8, further comprising a second pair of lines between the first pair of lines, each line of the second pair comprising at least one additional trench that is parallel with the trenches of the first pair of lines, and wherein each line of the second pair is offset transversely from the trenches of the first pair of lines so as to be spaced therefrom by a spacing in a range of between about 5 μm to about 10 μm.

13. The semiconductor wafer according to claim 12, wherein dimensions of the additional trenches of the second pair of lines are equal to dimensions of the trenches of the first pair of lines, and wherein the additional trenches of the second pair of lines are offset longitudinally from the trenches of the first pair of lines so as to overlap by an extent along their length.

14. A semiconductor wafer, comprising:
   a substrate;
   a plurality of upper layers and a plurality of die areas formed on the substrate, wherein the die areas are separated from each other by intersecting horizontal and vertical paths;
   a pair of spaced apart lines within each horizontal and vertical path, each line of the pair defining a dicing edge of the path, wherein each line comprises a plurality of trenches that have ends, wherein the trenches extend between a top surface of the wafer and the substrate of the wafer, wherein the plurality of trenches of each line have a finite length and are arranged end-to-end, and wherein an area of each path between adjacent intersections along the path includes more than one trench of the plurality of trenches for each line and wherein the ends of consecutive trenches have a horizontal cross-section with an acuate shape that promotes cracking propagation between the consecutive end-to-end trenches during dicing; and
   a polymeric stress absorbing material disposed within each trench.

15. The semiconductor wafer of claim 14, wherein each trench has a length of between about 30 μm to about 80 μm.

* * * * *